(12) United States Patent
Zhou et al.

(10) Patent No.: US 12,261,586 B2
(45) Date of Patent: Mar. 25, 2025

(54) SURFACE ACOUSTIC WAVE RESONATOR DEVICE AND METHOD FOR MANUFACTURING THE SAME AND FILTER

(71) Applicant: Shenzhen Newsonic Technologies Co., Ltd., Guangdong (CN)

(72) Inventors: Chencheng Zhou, Shenzhen (CN); Jie Zou, Guangdong (CN); Gongbin Tang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/418,709

(22) Filed: Jan. 22, 2024

(65) Prior Publication Data
US 2024/0204749 A1    Jun. 20, 2024

(30) Foreign Application Priority Data
Oct. 18, 2023   (CN) .......................... 202311345403.5

(51) Int. Cl.
*H03H 9/25*   (2006.01)
*H03H 3/08*   (2006.01)
*H03H 9/64*   (2006.01)

(52) U.S. Cl.
CPC ............... *H03H 9/25* (2013.01); *H03H 3/08* (2013.01); *H03H 9/64* (2013.01)

(58) Field of Classification Search
CPC .. H03H 3/02; H03H 3/08; H03H 3/10; H03H 2003/023; H03H 9/02543; H03H 9/02732;
(Continued)

(56) References Cited

U.S. PATENT DOCUMENTS 6,424,075 B1 * 7/2002 Inoue ....................... H03H 3/08
                                                            29/25.35
10,992,282 B1 * 4/2021 Plesski ................... H03H 9/205
(Continued)

FOREIGN PATENT DOCUMENTS

CN        111527698 A     8/2020
WO    WO-2019171476 A1 *  9/2019

OTHER PUBLICATIONS

WO-2019171476-A1 translation from FIT database (Year: 2024).*

*Primary Examiner* — Aneeta Yodichkas
*Assistant Examiner* — Joshua D Anderson
(74) *Attorney, Agent, or Firm* — LEASON ELLIS LLP

(57) ABSTRACT

A surface acoustic wave resonator device, and method for manufacturing the same and filter, the method includes: forming an interdigital transducer including interdigital electrodes on the piezoelectric substrate; forming the interdigital transducer includes: forming initial interdigital electrodes on the piezoelectric substrate, wherein each initial interdigital electrode has a first width, and every two adjacent initial interdigital electrodes have an initial interdigital gap with a first spacing therebetween; and forming additional interdigital electrodes on the piezoelectric substrate, wherein each initial interdigital gap has a portion filled by one of additional interdigital electrodes; each interdigital electrode includes an initial interdigital electrode and an additional interdigital electrode connected to each other; each interdigital electrode has a second width, and every two adjacent interdigital electrodes have a second spacing therebetween; the second width is greater than the first width, and the second spacing is smaller than the first spacing.

10 Claims, 9 Drawing Sheets

(58) Field of Classification Search
CPC ........ H03H 9/14541; H03H 9/25; H03H 9/64; Y10T 29/42; Y10T 29/49005; H10N 30/06; H10N 30/067
See application file for complete search history.

(56) References Cited

U.S. PATENT DOCUMENTS

| | | | |
|---|---|---|---|
| 2004/0164644 A1* | 8/2004 | Nishiyama | H03H 3/10 310/313 A |
| 2005/0122000 A1* | 6/2005 | Hakamada | H03H 9/14541 310/313 R |
| 2012/0200371 A1* | 8/2012 | Yamashita | H03H 3/08 29/25.35 |
| 2019/0229702 A1* | 7/2019 | Chen | H03H 3/08 |
| 2019/0288662 A1* | 9/2019 | Yang | H03H 9/02559 |
| 2021/0126621 A1* | 4/2021 | Plesski | H03H 9/132 |
| 2021/0126622 A1* | 4/2021 | Plesski | H03H 9/02228 |
| 2021/0376814 A1* | 12/2021 | Koskela | H03H 3/02 |
| 2021/0399710 A1* | 12/2021 | Plesski | H03H 9/02157 |
| 2021/0399714 A1* | 12/2021 | Koskela | H03H 9/564 |

* cited by examiner

SURFACE ACOUSTIC WAVE RESONATOR DEVICE AND METHOD FOR MANUFACTURING THE SAME AND FILTER

CROSS-REFERENCE TO RELATED APPLICATION(S)

The application claims priority to the Chinese patent application No. 202311345403.5, filed on Oct. 18, 2023, the entire disclosure of which is incorporated herein by reference as part of the present application.

TECHNICAL FIELD

The embodiments of the present disclosure relate to a surface acoustic wave resonator device, a manufacturing method thereof, and a filter.

BACKGROUND

With the rapid development of mobile communication technology, filters having resonators as basic units are more and more widely and extensively applied in communication devices such as smart phones. A surface acoustic wave (SAW) filter, as a kind of acoustic wave filter, has the advantages of small volume, light weight, etc. A SAW resonator typically includes a plurality of interdigital electrodes (i.e., fingers), and a resonator frequency is related to a spacing between fingers. In general, the smaller the spacing between fingers of the resonator, the higher the resonator frequency. However, in a manufacturing process of a resonator, a limit of the spacing between fingers usually depends on process conditions, such as the process capability of a photolithography machine. For some high-frequency resonator devices, it may be impossible to directly manufacture them under existing process conditions. Therefore, how to manufacture high-frequency resonator devices meeting requirements under existing process conditions is a research topic in the art.

SUMMARY

At least one embodiment of the present disclosure provides a method for manufacturing a surface acoustic wave resonator device, including: providing a piezoelectric substrate; and forming an interdigital transducer on the piezoelectric substrate, wherein the interdigital transducer includes a plurality of interdigital electrodes, and the plurality of interdigital electrodes extend along a first direction and are arranged at intervals along a second direction, wherein forming the interdigital transducer on the piezoelectric substrate includes: forming a plurality of initial interdigital electrodes on the piezoelectric substrate, wherein in the second direction, each initial interdigital electrode has a first width, and every two adjacent initial interdigital electrodes have an initial interdigital gap with a first spacing therebetween; and forming a plurality of additional interdigital electrodes on the piezoelectric substrate, wherein the plurality of additional interdigital electrodes are respectively connected to the plurality of initial interdigital electrodes, and each initial interdigital gap has a portion filled by one of the plurality of additional interdigital electrodes; each interdigital electrode includes an initial interdigital electrode and an additional interdigital electrode that are connected to each other; wherein in the second direction, the each interdigital electrode has a second width, and every two adjacent interdigital electrodes have a second spacing therebetween; the second width of the each interdigital electrode is greater than the first width of a corresponding initial interdigital electrode, and the second spacing between two adjacent interdigital electrodes is smaller than the first spacing between corresponding two adjacent initial interdigital electrodes.

In the method for manufacturing the surface acoustic wave resonator device provided by at least one embodiment of the present disclosure, the plurality of additional interdigital electrodes are formed to further cover portions of surfaces of the plurality of initial interdigital electrodes away from the piezoelectric substrate, respectively, and the plurality of additional interdigital electrodes respectively include a plurality of protruding parts; the plurality of protruding parts respectively protrude from the surfaces of the plurality of initial interdigital electrodes away from the piezoelectric substrate in a third direction perpendicular to the piezoelectric substrate.

The method for manufacturing the surface acoustic wave resonator device provided by at least one embodiment of the present disclosure further includes: performing a planarization process to at least remove the plurality of protruding parts of the plurality of additional interdigital electrodes.

In the method for manufacturing the surface acoustic wave resonator device provided by at least one embodiment of the present disclosure, in the second direction, each additional interdigital electrode has a third width; every two adjacent additional interdigital electrodes have a third spacing therebetween; the third width is smaller than or equal to the first width; and the third spacing is greater than or equal to the first spacing.

In the method for manufacturing the surface acoustic wave resonator device provided by at least one embodiment of the present disclosure, the third width is equal to the first width, the third spacing is equal to the first spacing, and the each additional interdigital electrode is offset with respect to a corresponding initial interdigital electrode in the second direction by a predetermined shift distance, and the predetermined shift distance is smaller than the first width and the third width.

In the method for manufacturing the surface acoustic wave resonator device provided by at least one embodiment of the present disclosure, forming the plurality of initial interdigital electrodes includes performing a first patterning process using a photomask, and the photomask is placed at a first position during the first patterning process; forming the plurality of additional interdigital electrodes includes performing a second patterning process using the photomask, wherein the photomask is placed at a second position during the second patterning process; and the second position is offset relative to the first position in the second direction.

In the method for manufacturing the surface acoustic wave resonator device provided by at least one embodiment of the present disclosure, forming the plurality of initial interdigital electrodes on the piezoelectric substrate includes: forming a first mask layer on the piezoelectric substrate, wherein the first mask layer includes a plurality of first mask patterns; and in the second direction, each first mask pattern has a first mask width, and every two adjacent first mask patterns have a first mask gap with a first mask spacing therebetween; forming the plurality of initial interdigital electrodes in the first mask gaps of the plurality of first mask patterns; and removing the first mask layer.

In the method for manufacturing the surface acoustic wave resonator device provided by at least one embodiment of the present disclosure, forming the plurality of additional interdigital electrodes on the piezoelectric substrate includes: forming a second mask layer on the piezoelectric substrate, wherein the second mask layer includes a plurality of second mask patterns, and in the second direction, each second mask pattern has a second mask width, and every two adjacent second mask patterns have a second mask gap with a second mask spacing therebetween; wherein each initial interdigital gap includes a first gap portion and a second gap portion; the first gap portion is filled by one of the plurality of second mask patterns, and the second gap portion is in spatial communication with the second mask gap; forming the plurality of additional interdigital electrodes in the second mask gaps of the plurality of second mask patterns, wherein the second gap portion of the each initial interdigital gap is filled by one of the plurality of additional interdigital electrodes; and removing the second mask layer.

In the method for manufacturing the surface acoustic wave resonator device provided by at least one embodiment of the present disclosure, the plurality of initial interdigital electrodes each include a first portion and a second portion adjacent to each other in the second direction; the plurality of second mask patterns cover sidewalls of first portions of the plurality of initial interdigital electrodes and surfaces of the first portions of the plurality of initial interdigital electrodes at a side away from the piezoelectric substrate, and the second mask gaps of the plurality of second mask patterns expose sidewalls of second portions of the plurality of initial interdigital electrodes and surfaces of the second portions of the plurality of initial interdigital electrodes at a side away from the piezoelectric substrate.

In the method for manufacturing the surface acoustic wave resonator device provided by at least one embodiment of the present disclosure, the first mask width is equal to the second mask width, and the first mask spacing is equal to the second mask spacing.

In the method for manufacturing the surface acoustic wave resonator device provided by at least one embodiment of the present disclosure, the first mask layer is formed by a first photolithography process using a first photomask; the second mask layer is formed by a second photolithography process using a second photomask; the first photomask and the second photomask are a same one photomask, and a position of the same one photomask during the second photolithography process is offset in the second direction relative to a position of the same one photomask during the first photolithography process.

In the method for manufacturing the surface acoustic wave resonator device provided by at least one embodiment of the present disclosure, a distance by which the same one photomask is offset in the second direction during the second lithography process is equal to a difference between the second width of the interdigital electrode and the first width of the initial interdigital electrode.

In the method for manufacturing the surface acoustic wave resonator device provided by at least one embodiment of the present disclosure, the second spacing between adjacent interdigital electrodes is smaller than the first mask width or the second mask width.

In the method for manufacturing the surface acoustic wave resonator device provided by at least one embodiment of the present disclosure, the second width of the interdigital electrode is greater than the first mask spacing or the second mask spacing.

In the method for manufacturing the surface acoustic wave resonator device provided by at least one embodiment of the present disclosure, each initial interdigital electrode has a first sidewall and a second sidewall opposite to each other in the second direction, and the first sidewall of the each initial interdigital electrode faces the second sidewall of an adjacent initial interdigital electrode; and the plurality of additional interdigital electrodes are disposed in one-to-one correspondence with the plurality of initial interdigital electrodes, and at least a portion of each additional interdigital electrode is formed on a side close to the second sidewall of a corresponding initial interdigital electrode in the second direction and in contact with the second sidewall.

At least one embodiment of the present disclosure provides a surface acoustic wave resonator device, including: a piezoelectric substrate; and an interdigital transducer, located on the piezoelectric substrate and including a plurality of interdigital electrodes, wherein the plurality of interdigital electrodes extend along a first direction and are arranged at intervals along a second direction, wherein each interdigital electrode includes an initial interdigital electrode and an additional interdigital electrode, and at least a portion of the additional interdigital electrode is located on a side of the initial interdigital electrode in the second direction and in contact with a sidewall of the initial interdigital electrode; wherein in the second direction, each initial interdigital electrode has a first width, and adjacent initial interdigital electrodes have a first spacing therebetween; each interdigital electrode has a second width, and adjacent interdigital electrodes have a second spacing therebetween; the second width is greater than the first width, and the second spacing is smaller than the first spacing.

In the surface acoustic wave resonator device provided by at least one embodiment of the present disclosure, an orthographic projection of the additional interdigital electrode on the piezoelectric substrate and an orthographic projection of the initial interdigital electrode on the piezoelectric substrate are adjoined with each other without overlapping each other.

In the surface acoustic wave resonator device provided by at least one embodiment of the present disclosure, a surface of the additional interdigital electrode at a side away from the piezoelectric substrate and a surface of the initial interdigital electrode at a side away from the piezoelectric substrate are level with each other in a direction parallel with a main surface of the piezoelectric substrate.

In the surface acoustic wave resonator device provided by at least one embodiment of the present disclosure, in each interdigital electrode, a length of the additional interdigital electrode in the first direction is equal to a length of the initial interdigital electrode in the first direction.

In the surface acoustic wave resonator device provided by at least one embodiment of the present disclosure, an orthographic projection of the additional interdigital electrode on the piezoelectric substrate partially overlaps an orthographic projection of the initial interdigital electrode on the piezoelectric substrate.

In the surface acoustic wave resonator device provided by at least one embodiment of the present disclosure, the additional interdigital electrode further includes a protruding part, and the protruding part is located on a side of the initial interdigital electrode away from the piezoelectric substrate in a third direction perpendicular to a main surface of the piezoelectric substrate, and covers a portion of a surface of the initial interdigital electrode away from the piezoelectric substrate.

In the surface acoustic wave resonator device provided by at least one embodiment of the present disclosure, one of the plurality of interdigital electrodes has a first thickness and a second thickness in the third direction, and the second thickness is greater than the first thickness; a portion of the one of the plurality of interdigital electrodes having the first thickness is a portion of the initial interdigital electrode that is not covered by the additional interdigital electrode, and a portion of the one of the plurality of interdigital electrodes having the second thickness includes the initial interdigital electrode and the protruding part of the additional interdigital electrode.

In the surface acoustic wave resonator device provided by at least one embodiment of the present disclosure, the additional interdigital electrode includes a widened portion, and the widened portion is located on a side of the initial interdigital electrode in the second direction, and a third thickness of the widened portion in the third direction is greater than or equal to the first thickness.

In the surface acoustic wave resonator device provided by at least one embodiment of the present disclosure, an interface is existed between the initial interdigital electrode and the additional interdigital electrode.

In the surface acoustic wave resonator device provided by at least one embodiment of the present disclosure, the plurality of interdigital electrodes include a first interdigital electrode and a second interdigital electrode adjacent to each other in the second direction; the first interdigital electrode includes a first initial interdigital electrode and a first additional interdigital electrode connected to each other, and the second interdigital electrode includes a second initial interdigital electrode and a second additional interdigital electrode connected to each other; the first initial interdigital electrode and the second initial interdigital electrode each have a first side and a second side opposite to each other in the second direction; the second side of the first initial interdigital electrode faces the first side of the second initial interdigital electrode; and at least a portion of the first additional interdigital electrode is disposed on the second side of the first initial interdigital electrode in the second direction, and at least a portion of the second additional interdigital electrode is disposed on the second side of the second initial interdigital electrode in the second direction.

At least one embodiment of the present disclosure provides a filter, including any one of the abovementioned surface acoustic wave resonator devices.

BRIEF DESCRIPTION OF THE DRAWINGS

In order to more clearly explain the technical solution of the embodiments of the present disclosure, the drawings of the embodiments will be briefly introduced below. It is obvious that the drawings in the following description only relate to some embodiments of the present disclosure, but do not intend to limit the present disclosure.

FIG. 2A to FIG. 8A illustrate schematic cross-sectional views of intermediate structures in various steps of a manufacturing method of a surface acoustic wave resonator device according to some embodiments of the present disclosure, respectively; and FIG. 2B to FIG. 8B respectively illustrate schematic top views of portions, located in an interdigital electrode body region, of the intermediate structures in the respective steps of the manufacturing method of a surface acoustic wave resonator device corresponding to FIG. 2A to FIG. 8A.

DETAILED DESCRIPTION

In order to make objects, technical solutions and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection" "connected", and the like are not limited to physical or mechanical connection but may include electrical connection, either directly or indirectly.

The embodiments of the present disclosure provide a surface acoustic wave resonator device, a manufacturing method thereof, and a filter. In the embodiments of the present disclosure, through forming additional interdigital electrodes after forming initial interdigital electrodes and filling at least part of gaps between the initial interdigital electrodes with the additional interdigital electrodes, the following technical effects can be achieved: the finally formed interdigital electrode can have a greater width, and spacing between adjacent interdigital electrodes can be smaller, and the method can break through the limitations of process conditions to obtain the interdigital electrodes having an expected size. As such, the following technical effects can be further achieved: a quality factor (Q value) of a surface acoustic wave resonator device and a filter can be increased by increasing the width of the interdigital electrode, and the frequency of the resonator device can be increased by reducing the spacing between the interdigital electrodes. In this way, a higher-frequency surface acoustic wave resonator device and filter can be obtained. In other words, the embodiments of the present disclosure can obtain a high-frequency surface acoustic wave resonator device and filter having improved device performance by forming the interdigital electrodes constituted by the initial interdigital electrodes and the additional interdigital electrodes.

Figure 1A:
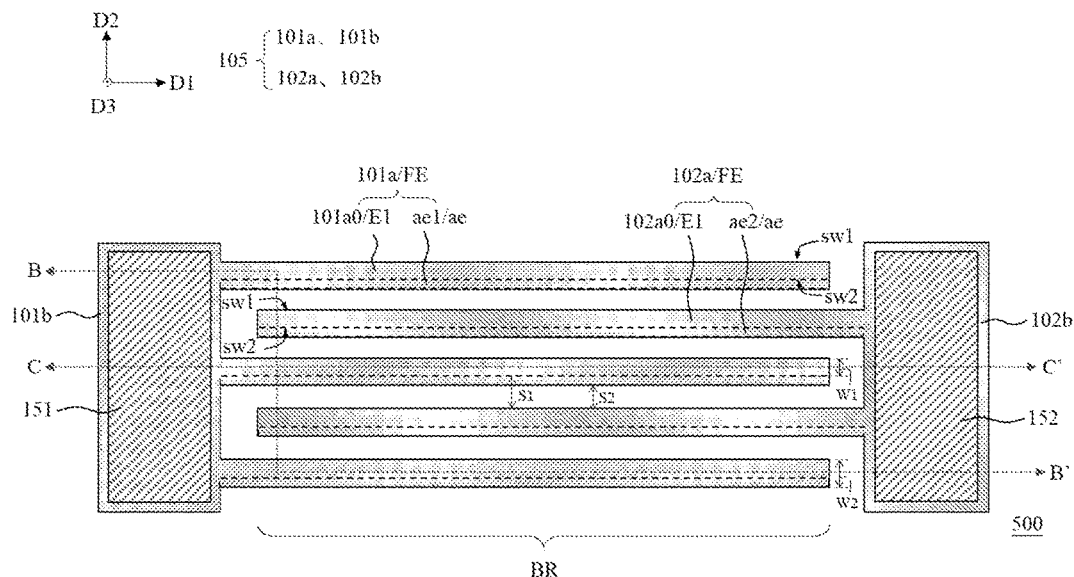
FIG. 1A illustrates a schematic top view of a surface acoustic wave resonator device according to some embodiments of the present disclosure.
Figure 1B:
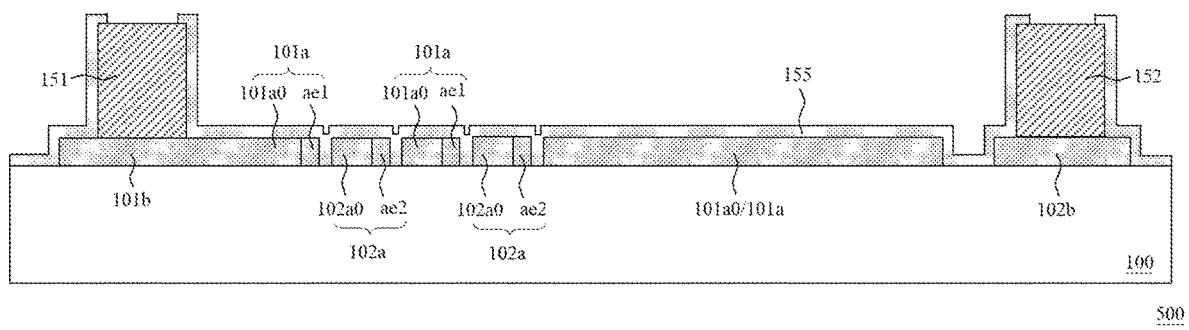
FIG. 1B illustrates a schematic cross-sectional view of the surface acoustic wave resonator device according to some embodiments of the present disclosure taken along a line B-B' of FIG. 1A.
Figure 1C:
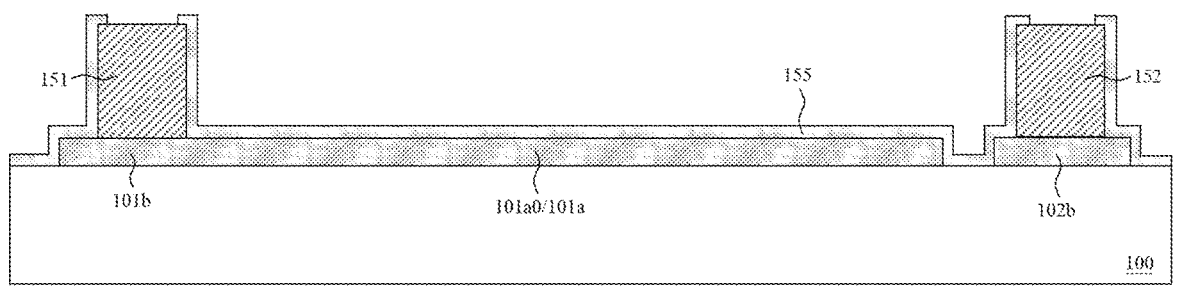
FIG. 1C illustrates a schematic cross-sectional view of the surface acoustic wave resonator device according to some embodiments of the present disclosure taken along a line C-C' of FIG. 1A.

FIG. 1A illustrates a schematic top view of a surface acoustic wave resonator device according to some embodiments of the present disclosure; and FIG. 1B and FIG. 1C illustrate schematic cross-sectional views of the surface acoustic wave resonator device according to some embodiments of the present disclosure taken along a line B-B' and a line C-C' of FIG. 1A, respectively.

Referring to FIG. 1A to FIG. 1C, in some embodiments, the surface acoustic wave resonator device 500 includes a piezoelectric substrate 100 and an interdigital transducer 105. The interdigital transducer 105 is located on the piezoelectric substrate 100 and includes a plurality of interdigital electrodes FE, a first interdigital electrode lead-out part 101b, and a second interdigital electrode lead-out part 102b. The plurality of interdigital electrodes FE may extend substantially parallel to each other along a first direction D1 and are arranged at intervals along a second direction D2, for example. Both of the first direction D1 and the second direction D2 are parallel to a main surface of the piezoelectric substrate 100, and the first direction D1 and the second direction D2 intersect with each other, for example, substantially perpendicular to each other. Each interdigital electrode FE includes an initial interdigital electrode E1 and an additional interdigital electrode ac connected to each other, and at least a portion of the additional interdigital electrode ac is located on a side of the initial interdigital electrode E1 in the second direction D2 and in contact with a sidewall of the initial interdigital electrode.

In some embodiments, in the second direction D2, each initial interdigital electrode E1 has a first width W1, and adjacent initial interdigital electrodes E1 have an initial interdigital gap with a first spacing S1 therebetween. Each interdigital electrode FE has a second width W2, and adjacent interdigital electrodes FE have a second spacing S2 therebetween. In some embodiments, the second width W2 is greater than the first width W1, and the second spacing S2 is smaller than the first spacing S1. It should be understood that, the first widths of the plurality of initial interdigital electrodes E1 may be the same as or different from each other, and the first spacings between different adjacent initial interdigital electrodes E1 may also be the same as or different from each other; and the second widths of the plurality of interdigital electrodes FE may be the same as or different from each other, and the second spacings between different adjacent interdigital electrodes FE may also be the same as or different from each other. Herein, the second width being greater than the first width refers to that the second width of each interdigital electrode is greater than the first width of the initial interdigital electrode included in the said interdigital electrode, and the second spacing being smaller than the first spacing refers to that the second spacing between two adjacent interdigital electrodes is smaller than the first spacing between two initial interdigital electrodes included in the two adjacent interdigital electrodes.

In some embodiments, in each interdigital electrode FE, a length of the additional interdigital electrode ac in the first direction D1 may be substantially the same as a length of the initial interdigital electrode E1 in the first direction D1. However, the present disclosure is not limited thereto.

For example, the plurality of interdigital electrodes FE may include one or more first interdigital electrodes 101a and one or more second interdigital electrodes 102a. In some embodiments, a plurality of first interdigital electrodes 101a and a plurality of second interdigital electrodes 102a are arranged alternately in the second direction D2. The surface acoustic wave resonator device 500 has an interdigital electrode body region BR, and portions, located in the interdigital electrode body region BR, of the first interdigital electrodes 101a and the second interdigital electrodes 102a overlap each other in the second direction D2. The first interdigital electrode lead-out part 101b and the second interdigital electrode lead-out part 102b may be located on two opposite sides of the interdigital electrode body region BR in the first direction D1, and connected to the first interdigital electrodes 101a and the second interdigital electrodes 102a, respectively. For example, the plurality of first interdigital electrodes 101a may be electrically connected to each other through the first interdigital electrode lead-out part 101b, and the plurality of second interdigital electrodes 102a may be electrically connected to each other through the second interdigital electrode lead-out part 102b. The first interdigital electrodes 101a and the first interdigital electrode lead-out part 101b constitute a first interdigital electrode structure, and the second interdigital electrodes 102a and the second interdigital electrode lead-out part 102b constitute a second interdigital electrode structure, and the first interdigital electrode structure and the second interdigital electrode structure are electrically isolated from each other.

In some embodiments, each first interdigital electrode 101a includes a first initial interdigital electrode 101a0 and a first additional interdigital electrode ae1 connected to each other. Each second interdigital electrode 102a includes a second initial interdigital electrode 102a0 and a second additional interdigital electrode ae2 connected to each other.

Each initial interdigital electrode E1 has a first sidewall sw1 and a second sidewall sw2 opposite to each other in the second direction D2. That is, each initial interdigital electrode has a first side and a second side opposite to each other in the second direction D2, and the first side is a side where the first sidewall sw1 is located or close to the first sidewall sw1, and the second side is a side where the second sidewall sw2 is located or close to the second sidewall sw2. In the adjacent first interdigital electrode 101a and second interdigital electrode 102a, the second sidewall sw2 and the second side of the first initial interdigital electrode 101a0 face or are close to the first sidewall sw1 and the first side of the second initial interdigital electrode 102a0; alternatively, the first sidewall sw1 and the first side of the first initial interdigital electrode 101a0 face or are close to the second sidewall sw2 and the second side of the second initial interdigital electrode 102a0.

In some embodiments, a plurality of additional interdigital electrodes may be disposed on the first sides of a plurality of initial interdigital electrodes, respectively, or the plurality of additional interdigital electrodes may be disposed on the second sides of the plurality of initial interdigital electrodes, respectively. For example, the first additional interdigital electrode ae1 is disposed on the second side of the first initial interdigital electrode 101a0 and in contact with the second sidewall sw2 of the first initial interdigital electrode 101a0. The second additional interdigital electrode ae2 is disposed on the second side of the second initial interdigital electrode 102a0 and in contact with the second sidewall sw2 of the second initial interdigital electrode 102a0.

In some embodiments, for the initial interdigital electrode E1 and the additional interdigital electrode ac that are connected to each other, an orthographic projection of the additional interdigital electrode ac on the piezoelectric substrate 100 and an orthographic projection of the initial interdigital electrode E1 on the piezoelectric substrate 100 border each other but do not overlap. That is, the additional interdigital electrode ac may be in contact with only the second sidewall of the initial interdigital electrode E1. For example, a surface (i.e., a top surface shown in the cross-sectional view) of the additional interdigital electrode ac at a side away from the piezoelectric substrate 100 in a third direction D3 perpendicular to the main surface of the piezoelectric substrate 100 and a surface (i.e., a top surface shown in the cross-sectional view) of the initial interdigital electrode E1 at the side away from the piezoelectric substrate 100 in the third direction D3 are substantially level with each other in a direction parallel to the main surface of the piezoelectric substrate 100. A thickness of the additional interdigital electrode ac in the third direction D3 may be substantially the same as a thickness of the initial interdigital electrode E1 in the third direction D3. However, the present disclosure is not limited thereto.

The initial interdigital electrode E1 and the additional interdigital electrode ac may have materials the same as or different from each other. In some embodiments, in the same one interdigital electrode FE, there may be an interface between the initial interdigital electrode E1 and the additional interdigital electrode ac. However, the present disclosure is not limited thereto. In some other embodiments, in the same one interdigital electrode FE, there may also be free of obvious interface between the initial interdigital electrode E1 and the additional interdigital electrode ac.

Figure 7A:
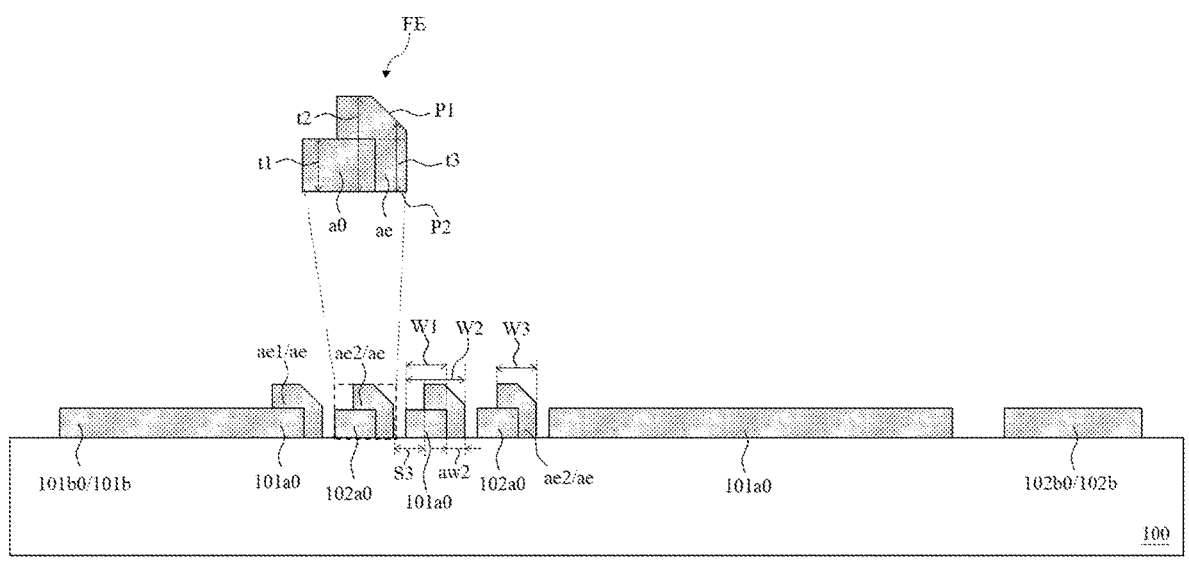
Figure 7B:
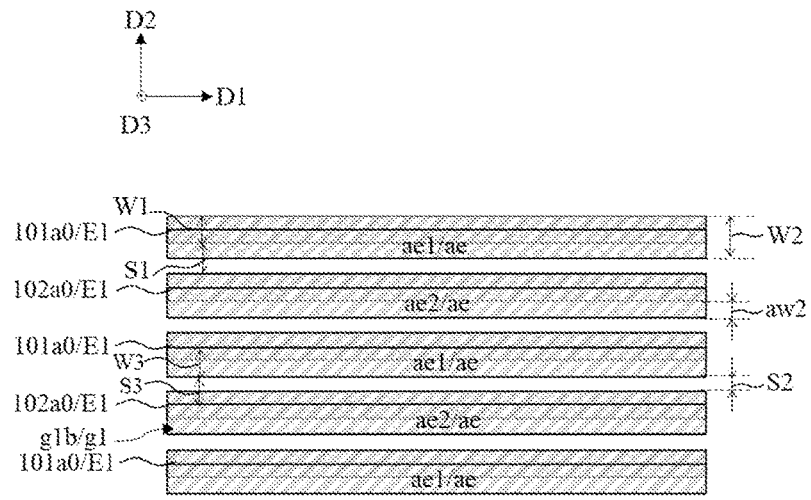

In some other embodiments, for example, as shown in FIG. 7A and FIG. 7B, the orthographic projection of the additional interdigital electrode ac on the piezoelectric substrate 100 may partially overlap the orthographic projection of the initial interdigital electrode E1 on the piezoelectric substrate 100, and the additional interdigital electrode ac extends beyond an edge of the initial interdigital electrode E1 in the second direction D2.

For example, the additional interdigital electrode ac further includes a protruding part P1. The protruding part P1 is located on a side of the initial interdigital electrode E1 away from the piezoelectric substrate 100 in the third direction D3 perpendicular to the main surface of the piezoelectric substrate 100, and covers a portion of a surface of the initial interdigital electrode E1 away from the piezoelectric substrate 100.

In some embodiments, the interdigital electrode FE has a first thickness t1 and a second thickness t2 in the third direction D3, and the second thickness t2 is greater than the first thickness t1. For example, a portion of the interdigital electrode FE having the first thickness t1 is a portion of the initial interdigital electrode E1 that is not covered by the additional interdigital electrode ac, and a portion of the interdigital electrode FE having the second thickness t2 includes portions of the initial interdigital electrode E1 and the protruding part P1 of the additional interdigital electrode ac that are overlapped with each other in the third direction D3.

In some embodiments, the additional interdigital electrode ac includes a widened portion P2. The widened portion P2 is located on a side (e.g., the second side) of the initial interdigital electrode E1 in the second direction D2, and a third thickness t3 of the widened portion P2 in the third direction is greater than or equal to the first thickness t1. For example, as shown in FIG. 7A and FIG. 7B, the thickness of the widened portion P2 may gradually decrease as being away from the sidewall of the initial interdigital electrode E1 in the second direction, and the minimum thickness of the widened portion P2 may be greater than or equal to the first thickness t1. Herein, the third thickness t3 of the widened portion P2 may be the minimum thickness or an average thickness thereof.

In some embodiments, the surface acoustic wave resonator device 500 may further include a first conductive connector 151 and a second conductive connector 152. The first conductive connector 151 is disposed on a side of the first interdigital electrode lead-out part 101b away from the piezoelectric substrate 100, and electrically connected to the first interdigital electrode lead-out part 101b. The second conductive connector 152 is disposed on a side of the second interdigital electrode lead-out part 102b away from the piezoelectric substrate 100, and electrically connected to the second interdigital electrode lead-out part 102b. The first conductive connector 151 and the second conductive connector 152 may partially overlap the first interdigital electrode lead-out part 101b and the second interdigital electrode lead-out part 102b in the third direction D3 perpendicular to the main surface of the piezoelectric substrate 100, respectively. For example, an orthographic projection of the first conductive connector 151 on the piezoelectric substrate 100 may be located within a range of an orthographic projection of the first interdigital electrode lead-out part 101b on the piezoelectric substrate 100. An orthographic projection of the second conductive connector 152 on the piezoelectric substrate 100 may be located within a range of an orthographic projection of the second interdigital electrode lead-out part 102b on the piezoelectric substrate 100. However, the present disclosure is not limited thereto.

In some embodiments, the surface acoustic wave resonator device 500 may further include a passivation layer 155. The passivation layer 155 may cover a surface of the interdigital transducer 105 and portions of surfaces of the first conductive connector 151 and the second conductive connector 152. The passivation layer 155 may have a plurality of openings. The plurality of openings respectively expose portions of surfaces of the first conductive connector 151 and the second conductive connector 152 at a side away from the piezoelectric substrate 100, so as to provide external connection windows. In some embodiments, the passivation layer 155 is directly formed on the interdigital transducer 105. However, the present disclosure is not limited thereto. In some other embodiments, other components, such as a temperature compensation layer, a metal structure for clutter suppression, etc., may further be formed between the interdigital transducer 105 and the passivation layer 155.

The embodiments of the present disclosure provide a manufacturing method of a surface acoustic wave resonator device, including: providing a piezoelectric substrate; and forming an interdigital transducer on the piezoelectric substrate, wherein the interdigital transducer includes a plurality of interdigital electrodes, and the plurality of interdigital electrodes extend along a first direction and are arranged at intervals along a second direction, wherein forming the interdigital transducer on the piezoelectric substrate includes: forming a plurality of initial interdigital electrodes on the piezoelectric substrate, wherein in the second direction, each initial interdigital electrode has a first width, and every two adjacent initial interdigital electrodes have an initial interdigital gap with a first spacing therebetween; and forming a plurality of additional interdigital electrodes on the piezoelectric substrate, wherein the plurality of additional interdigital electrodes are respectively connected to the plurality of initial interdigital electrodes, and a portion of each initial interdigital gap is filled by one of the plurality of additional interdigital electrodes; each interdigital electrode includes an initial interdigital electrode and an additional interdigital electrode connected to each other; wherein in the second direction, each interdigital electrode has a second width, and every two adjacent interdigital electrodes have a second spacing therebetween; the second width of each interdigital electrode is greater than the first width of the corresponding initial interdigital electrode, and the second spacing between two adjacent interdigital electrodes is smaller than the first spacing between the corresponding two adjacent initial interdigital electrodes.

For example, FIG. 2A to FIG. 8A illustrate schematic cross-sectional views of a manufacturing method of a surface acoustic wave resonator device according to some embodiments of the present disclosure, and specifically illustrate a manufacturing method for forming an interdigital transducer in the surface acoustic wave resonator device.

FIG. 2A to FIG. 8A are schematic cross-sectional views respectively illustrating intermediate structures in the respective steps of the manufacturing method and correspondingly taken along the line B-B' of FIG. 1A. FIG. 2B to FIG. 8B respectively illustrate schematic top views of the intermediate structures in an interdigital electrode body region in the respective steps corresponding to FIG. 2A to FIG. 8A.

Figure 2A:
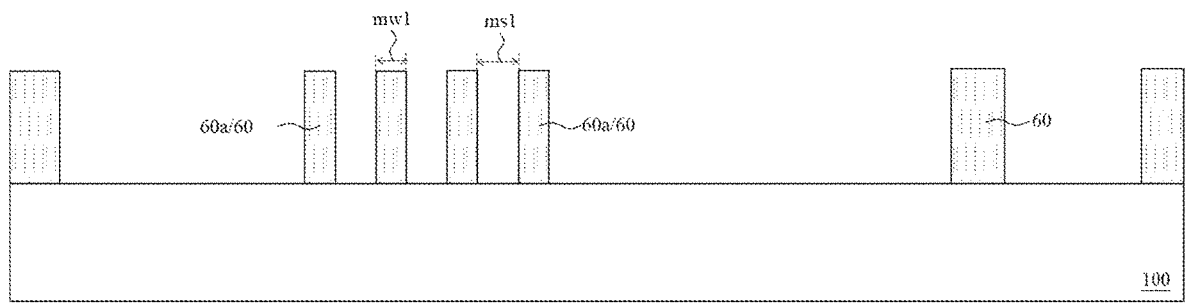

Referring to FIG. 2A, a piezoelectric substrate 100 is provided. The piezoelectric substrate 100 may include a suitable piezoelectric material such as piezoelectric crystal, piezoelectric ceramics or the like. For example, the material of the piezoelectric substrate 100 may include aluminum nitride (AlN), doped aluminum nitride, zinc oxide (ZnO), lead zirconate titanate (PZT), lithium niobate ($LiNbO_3$), quartz, potassium niobate ($KNbO_3$), lithium tantalate ($LiTaO_3$), the like or combinations thereof. In some embodiments, the piezoelectric substrate 100 may be a single-layer structure or a multi-layer structure, such as a piezoelectric film composite structure, such as a composite structure of a lithium tantalate piezoelectric film/silicon dioxide/silicon substrate. In some embodiments, the piezoelectric substrate 100 may be a monocrystalline piezoelectric substrate. However, the present disclosure is not limited thereto.

Referring to FIG. 2A to FIG. 4A, in some embodiments, forming a plurality of initial interdigital electrodes E1 on the piezoelectric substrate 100 includes preforming a first patterning process using a photomask (e.g., a first photomask, not shown). The first patterning process may include forming a first mask layer having an opening on the piezoelectric substrate and forming an electrode pattern including a plurality of initial interdigital electrodes in the opening of the first mask layer.

For example, a first mask layer 60 is formed on the piezoelectric substrate 100. The first mask layer 60 may be or include a patterned photoresist layer. In some embodiments, the first mask layer 60 may be formed by the following process: a mask material layer is formed on the piezoelectric substrate 100, and the mask material layer may include a photoresist layer and may be formed by processes such as coating and deposition; thereafter, a first photolithography process including exposure and development is performed on the mask material layer to pattern the mask material layer and form the first mask layer 60. For example, the exposure process includes performing an exposure process on the mask material layer using a photomask which has a pattern corresponding to an initial interdigital electrode structure. After the exposure process, the mask material layer includes an exposed portion and an unexposed portion. Then, a development process is performed on the mask material layer. In some examples, the mask material layer includes a negative photoresist, and the development process removes the unexposed portion of the mask material layer, and the exposed portion forms the first mask layer 60 after the development process. However, the present disclosure is not limited thereto. In an alternative embodiment, the first mask layer may also include a positive photoresist material.

In some embodiments, the first mask layer 60 has a pattern corresponding to the interdigital transducer. For example, the first mask layer 60 has a plurality of openings, and the pattern of the plurality of openings are consistent with the pattern of the interdigital transducer. For example, the plurality of openings may include a first interdigital electrode region and a first interdigital electrode lead-out region respectively corresponding to interdigital electrode(s) and an interdigital electrode lead-out part of a first interdigital electrode structure formed subsequently, and a second interdigital electrode region and a second interdigital electrode lead-out region respectively corresponding to interdigital electrode(s) and an interdigital electrode lead-out part of a second interdigital electrode structure formed subsequently. The openings of the first mask layer 60 may expose portions of a main surface of the piezoelectric substrate 100.

In some embodiments, a portion of the first mask layer 60 includes a plurality of first mask patterns 60a. The plurality of first mask patterns 60a are located in the interdigital electrode body region and have patterns corresponding to a plurality of initial interdigital electrodes formed subsequently.

Figure 2B:
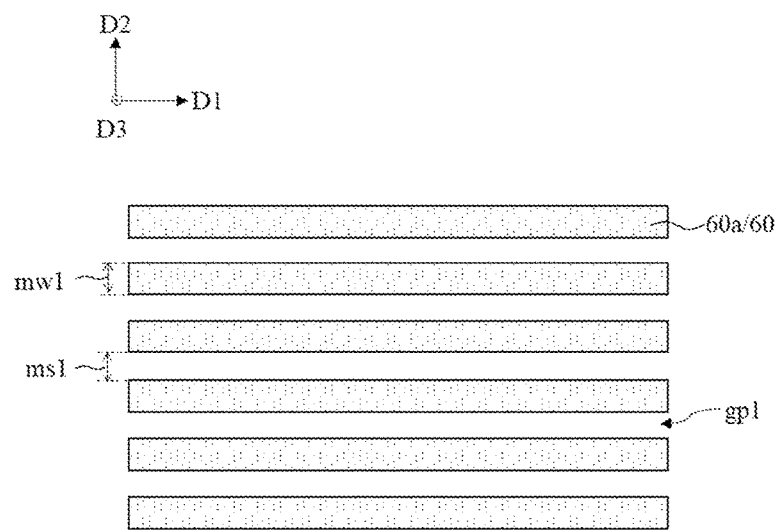

FIG. 2B illustrates a schematic top view of the plurality of first mask patterns 60a in the first mask layer 60. For the sake of brevity of the figure, FIG. 2B merely illustrates the mask patterns corresponding to the interdigital electrode body region, without illustrating mask patterns corresponding to the other regions of the interdigital transducer.

Referring to FIG. 2A and FIG. 2B, in some embodiments, the plurality of first mask patterns 60a extend substantially parallel to each other along the first direction D1 and are arranged at intervals along the second direction D2. In the second direction D2, each first mask pattern 60a has a first mask width mw1, and every two adjacent first mask patterns 60a have a first mask gap gp1 with a first mask spacing ms1 therebetween. The first mask gap gp1 extends in the first direction D1, and is a portion of the opening of the first mask layer 60.

The first widths mw1 of the plurality of first mask patterns 60a may be the same as or different from each other, and the first spacings ms1 between the respective adjacent first mask patterns 60a may be the same as or different from each other. Herein, the width of the mask pattern refers to a width thereof in an arrangement direction of the mask patterns, and the spacing of the mask patterns refers to a distance between sidewalls, facing each other, of two adjacent mask patterns in the arrangement direction of the mask patterns, that is, the width of the mask gap in the arrangement direction.

Figure 3A:
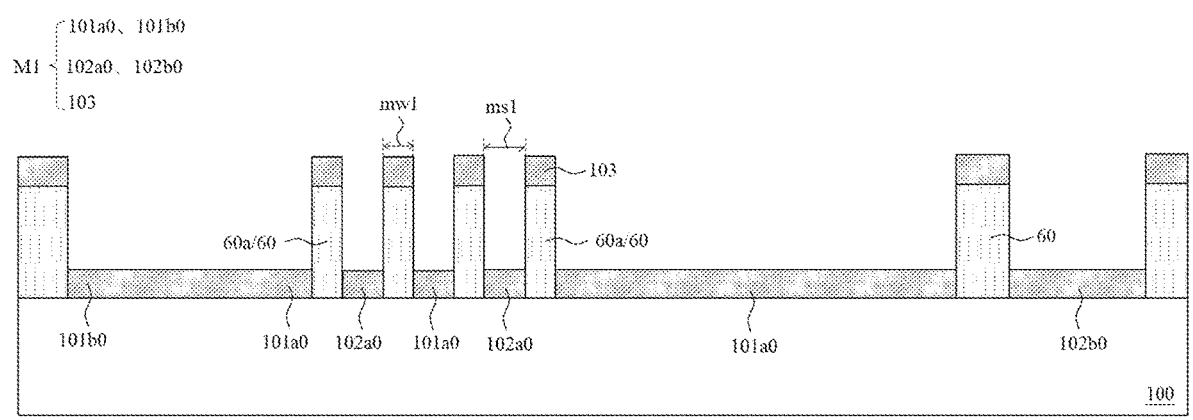

Referring to FIG. 3A, an initial interdigital transducer is formed in the openings of the second mask layer 60. The initial interdigital transducer includes a first initial interdigital electrode structure and a second initial interdigital electrode structure, wherein the first initial interdigital electrode structure includes first initial interdigital electrode(s) 101a0 and a first initial interdigital electrode lead-out part 101b0 that are connected to each other, and the second initial interdigital electrode structure includes second initial interdigital electrode(s) 102a0 and a second initial interdigital electrode lead-out part 102b0 that are connected to each other.

For example, a first electrode material layer M1 is formed on the piezoelectric substrate 100 and the first mask layer 60. The first electrode material layer M1 is formed in the openings of the first mask layer 60 and on a surface of the first mask layer 60 at a side away from the piezoelectric substrate 100. A portion of the first electrode material layer M1 formed in the openings of the first mask layer 60 constitute the initial interdigital transducer. For example, portions of the first electrode material layer M1 formed in the first interdigital electrode region, the first interdigital electrode lead-out region, the second interdigital electrode region, and the second interdigital electrode lead-out region of the openings of the first mask layer 60 respectively form the first initial interdigital electrode(s) 101a0, the first initial interdigital electrode lead-out part 101b0, the second initial interdigital electrode 102a0, and the second initial interdigital electrode lead-out part 102b0. The first electrode material layer M1 further includes a sacrificial portion 103. The sacrificial portion 103 is formed on a surface of the first mask layer 60 at a side away from the piezoelectric substrate 100, and will be removed in a subsequent process.

In some embodiments, the first electrode material layer M1 may include a metal material, for example, may include one or more of metal materials such as Ti, Cr, Ag, Cu, Mo, Pt, W, Al, alloys thereof, and the like. The first electrode material layer M1 may be a single-layer structure or a multi-layer structure, such as a stacked layer including a combination of two or more of the above-mentioned metal materials. The electrode material layer may be formed by a deposition process such as evaporation. However, the present disclosure is not limited thereto.

Figure 3B:
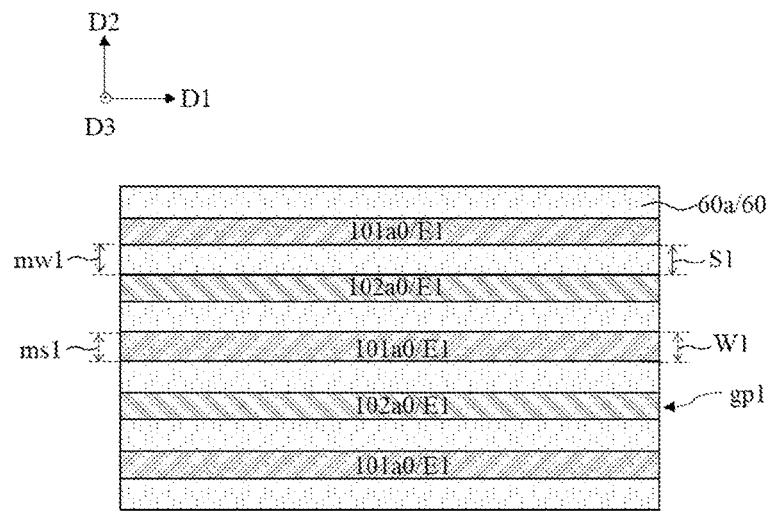

FIG. 3B illustrates a schematic top view of a plurality of mask patterns and a plurality of initial interdigital electrodes that are located in the interdigital electrode body region.

Referring to FIG. 3A and FIG. 3B, forming the initial interdigital transducer in the openings of the first mask layer includes forming a plurality of initial interdigital electrodes E1 in the plurality of first mask gaps gp1 of the plurality of first mask patterns 60a, respectively. For example, the plurality of initial interdigital electrodes E1 include one or more first initial interdigital electrodes 101a0 and one or more second initial interdigital electrodes 102a0. The first initial interdigital electrode(s) 101a0 and the second initial interdigital electrode(s) 102a0 extend substantially parallel to each other along the first direction D1 and are arranged alternately along the second direction D2. Each initial interdigital electrode E1 has a first width W1, and every two adjacent initial interdigital electrodes have a first spacing S1 therebetween. The plurality of initial interdigital electrodes E1 may have widths that are substantially the same as each other or different from each other, and may be spaced apart from each other with substantially the same or different spacings.

In some embodiments, the first width W1 of the initial interdigital electrode E1 is defined by the first mask spacing ms1 between adjacent first mask patterns 60a, and the first spacing S1 between adjacent initial interdigital electrodes E1 is defined by the first mask width mw1 of the first mask pattern 60a. That is, the first width W1 is substantially equal to the first mask spacing ms1, and the first spacing S1 is substantially equal to the first mask width mw1.

Referring to FIG. 3A to FIG. 4A, the first mask layer 60 and the sacrificial portion 103 of the electrode material layer M1 covering the first mask layer 60 are removed, and the remained electrode material layer forms the initial interdigital transducer including the first initial interdigital electrode(s) 101a0, the first initial interdigital electrode lead-out part 101b0, the second initial interdigital electrode(s) 102a0, and the second initial interdigital electrode lead-out part 102b0. In some examples, the first mask layer 60 includes a photoresist material, and the first mask layer 60 and the overlying sacrificial portion 103 of the electrode material layer M1 may be removed by a lift-off process.

Figure 4A:
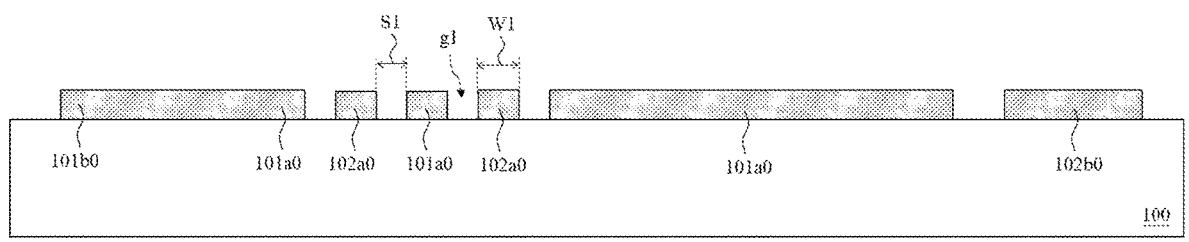
Figure 4B:
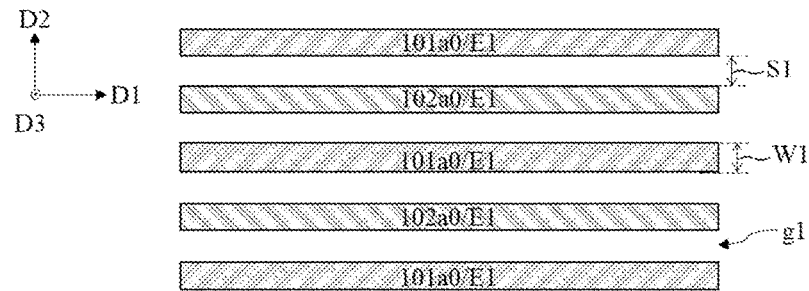

FIG. 4B illustrates a schematic top view of a plurality of initial interdigital electrodes E1 located in the interdigital electrode body region.

Referring to FIG. 4A and FIG. 4B, among the plurality of initial interdigital electrodes E1, every two adjacent initial interdigital electrodes have an initial interdigital gap g1 therebetween, and a width of the initial interdigital gap g1 in the second direction D2 is the first spacing S1 between adjacent initial interdigital electrodes.

Referring to FIG. 4A, FIG. 4B, FIG. 7A, and FIG. 7B, after the plurality of initial interdigital electrodes E1 are formed, a plurality of additional interdigital electrodes ac are formed on the piezoelectric substrate 100. The plurality of additional interdigital electrodes ac are respectively connected to the plurality of initial interdigital electrodes E1, so that the plurality of initial interdigital electrodes E1 and the plurality of additional interdigital electrodes together constitute a plurality of interdigital electrodes, and a portion of each initial interdigital gap g1 is filled by a corresponding one of the plurality of additional interdigital electrodes ac.

In some embodiments, the plurality of additional interdigital electrodes ac are formed to further cover portions of surfaces of the plurality of initial interdigital electrodes E1 at the side away from the piezoelectric substrate 100, respectively, and the plurality of additional interdigital electrodes ac include a plurality of protruding parts P1, respectively. The plurality of protruding parts P1 respectively protrude from the surfaces of the plurality of initial interdigital electrodes E1 away from the piezoelectric substrate 100 in the third direction D3 perpendicular to the piezoelectric substrate 100.

For example, in the second direction D2, each additional interdigital electrode ac has a third width W3, and every two adjacent additional interdigital electrodes ae2 have a third spacing S3 therebetween. The third width W3 may be smaller than or equal to the first width W1, and the third spacing S3 may be greater than or equal to the first spacing S1. It should be understood that, the plurality of additional interdigital electrodes may have widths that are the same as or different from each other, and different adjacent additional interdigital electrodes may have spacings that are the same as or different from each other. Herein, the third width being smaller than or equal to the first width indicates that the third width W3 of the additional interdigital electrode ac is smaller than or equal to the first width W1 of the initial interdigital electrode E1 connected thereto. The third spacing being greater than or equal to the first spacing indicates that the third spacing S3 between two adjacent additional interdigital electrodes is greater than or equal to the first spacing S1 between two adjacent initial interdigital electrodes that are respectively connected to the two adjacent additional interdigital electrodes.

In some embodiments, the third width W3 and the third spacing S3 are equal to the first width W1 and the first spacing S1, respectively, and each additional interdigital electrode ac is laterally shifted with respect to the corresponding initial interdigital electrode E1 connected thereto, in the second direction D2 with a predetermined shift distance which is smaller than the first width W1 and the third width W3. In some embodiments, in the second direction D2, the plurality of additional interdigital electrodes ac are respectively offset from the plurality of initial interdigital electrodes E1 along the same direction (e.g., offset downward as shown in FIG. 7B). Herein, in each interdigital electrode, a shift distance of the additional interdigital electrode in the second direction D2 relative to the initial interdigital electrode refers to a distance between a sidewall, facing an adjacent interdigital electrode, of the additional interdigital electrode and a sidewall, facing the adjacent interdigital electrode and in contact with the additional interdigital electrode, of the initial interdigital electrode in the second direction D2. The adjacent interdigital electrode is adjacent to and spaced apart from the interdigital electrode constituted by the additional interdigital electrode and the initial interdigital electrode in the second direction D2.

In some embodiments, forming the plurality of additional interdigital electrodes ac on the piezoelectric substrate 100 may include performing a second patterning process using a photomask (e.g., a second photomask). For example, the first photomask used in the first patterning process for forming the plurality of initial interdigital electrodes E1 and the second photomask used in the second patterning process for forming the plurality of additional interdigital electrodes ae may be the same one photomask. For example, the photomask is placed at a first position in the first patterning process and placed at a second position in the second patterning process, and the second position is laterally shifted with respect to the first position in the second direction D2. For example, the abovementioned shift distance of the additional interdigital electrode in the second direction relative to the initial interdigital electrode may be defined by a shift distance of the photomask in the two patterning processes. However, the present disclosure is not limited thereto. In some other embodiments, the first photomask and the second photomask may also be different photomasks. An example of the second patterning process is described in detail below.

Figure 5A:
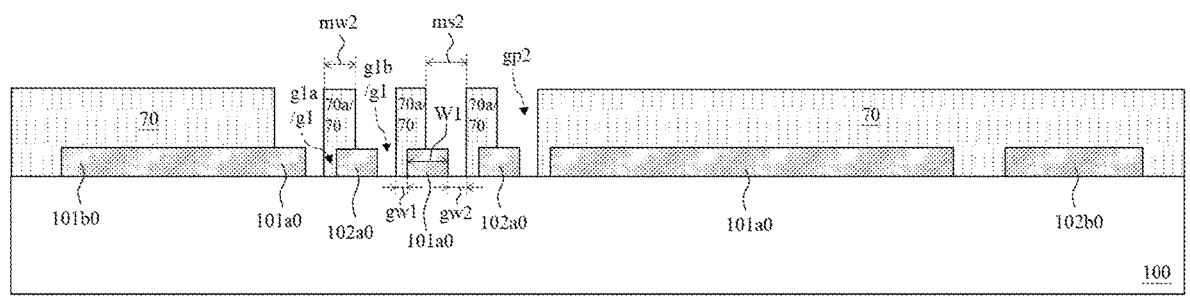

For example, Referring to FIG. 5A, a second mask layer 70 is formed on the piezoelectric substrate 100. The second mask layer 70 may cover a portion of the initial interdigital transducer, and has an opening to expose the other portion of the initial interdigital transducer, for example, expose at least portions of the initial interdigital gaps between the plurality of initial interdigital electrodes. For example, the second mask layer 70 includes a plurality of second mask patterns 70a disposed corresponding to the interdigital electrode body region.

Figure 5B:
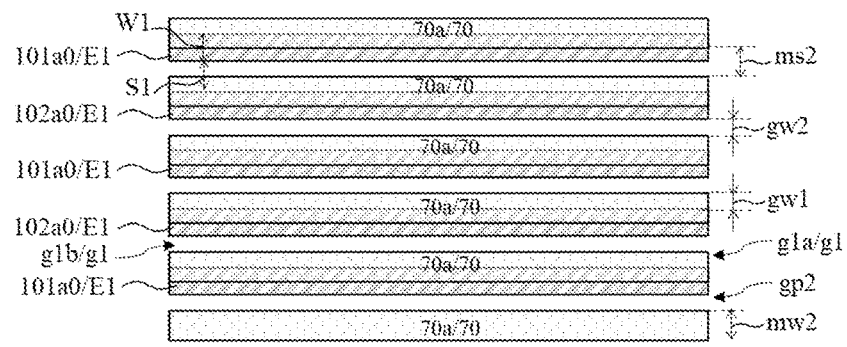

FIG. 5B illustrates a schematic top view of the plurality of initial interdigital electrodes E1 and the plurality of second mask patterns 70a.

Referring to FIG. 5A and FIG. 5B, at least portions of the plurality of second mask patterns 70a extend substantially parallel to each other along the first direction D1 and are arranged along the second direction D2 and spaced apart from each other. In the second direction D2, each second mask pattern 70a has a second mask width mw2, and every two adjacent second mask patterns 70a have a second mask gap gp2 with a second mask spacing ms2 therebetween. The second mask widths mw2 of the plurality of second mask patterns 70a may be approximately the same as or different from each other, and the plurality of second mask patterns 70a may be spaced apart from each other with substantially the same or different second mask spacings ms2.

In some embodiments, the initial interdigital gap g1 between every two adjacent initial interdigital electrodes E1 includes a first gap portion g1a and a second gap portion g1b. The first gap portion g1a is filled by the second mask pattern 70a, and the second gap portion g1b is in spatial communication with the second mask gap gp2, so as to be exposed by the second mask layer 70. For example, the first gap portion g1a of the initial interdigital gap g1 has a width gw1 in the second direction D2, and the second gap portion g1b of the initial interdigital gap g1 has a width gw2 in the second direction D2.

The width mw2 of the second mask pattern 70a may be greater than or equal to the width gw1 of the first gap portion g1a and may be smaller than or equal to (e.g., smaller than) a sum of the width gw1 of the first gap portion g1a and the width W1 of the initial interdigital electrode E1. The second mask spacing ms2 between adjacent second mask patterns 70a may be greater than or equal to the width gw2 of the second gap portion g1b of the initial interdigital gap g1 and may be smaller than or equal to (e.g., smaller than) a sum of the width gw2 of the second gap portion g1b and the width W1 of the initial interdigital electrode E1.

In some embodiments, the second mask pattern 70a fills at least the first gap portion g1a of the initial interdigital gap g1 and may cover a portion of a surface of the initial interdigital electrode E1 at the side away from the piezoelectric substrate in the third direction D3. In some embodiments, each initial interdigital electrode E1 has a first sidewall and a second sidewall opposite to each other in the second direction D2, and the first sidewall is covered with the second mask pattern 70a, while the second sidewall is exposed by the opening (i.e., the second mask gap gp2) of the mask layer.

For example, the plurality of initial interdigital electrodes E1 each include a first portion and a second portion adjacent to each other in the second direction, and both of the first portion and the second portion extend in the first direction D1. The plurality of second mask patterns 70a cover sidewalls (e.g., first sidewalls) of the first portions of the plurality of initial interdigital electrodes E1 and surfaces thereof at a side away from the piezoelectric substrate 100, respectively, and the second mask gaps gp2 of the plurality of second mask patterns 70a expose sidewalls (e.g., second sidewalls) of the second portions of the plurality of initial interdigital electrodes E1 and surfaces thereof at the side away from the piezoelectric substrate 100, respectively.

In some embodiments, the second mask layer 70 may be formed by the following process: a mask material layer is formed on the piezoelectric substrate 100, where the mask material layer may include, for example, a photoresist layer and may be formed by a process such as coating or deposition; then, a second photolithography process including exposure and development is performed on the mask material layer to pattern the mask material layer and form the second mask layer 70. For example, the exposure process includes performing the exposure process on the mask material layer using a photomask (e.g., a second photomask). After the exposure process, the mask material layer includes an exposed portion and an unexposed portion. Thereafter, the development process is performed on the mask material layer. In some examples, the mask material layer includes a negative photoresist, and the development process removes the unexposed portion of the mask material layer, and the exposed portion forms the second mask layer 70.

In some embodiments, the second mask width mw2 of the second mask pattern 70a and the second mask spacing ms2 between adjacent second mask patterns 70a are approximately the same as the first mask width mw1 of the first mask pattern 60a (FIG. 3A and FIG. 3B) and the first mask spacing ms1 between adjacent first mask pattern 60a, respectively. For example, an overall pattern constituted by the plurality of second mask patterns 70a is substantially the same as an overall pattern constituted by the plurality of first mask patterns 60a. For example, the overall pattern of the second mask layer 70 may be substantially the same as the overall pattern of the first mask layer 60. For example, the plurality of second mask patterns 70a is offset relative to the plurality of first mask patterns 60a in the second direction D2 with a predetermined distance, such that the second mask patterns fill into portions of initial interdigital gaps. For example, a shift distance of the plurality of second mask patterns 70a in the second direction D2 relative to the plurality of first mask patterns 60a is substantially equal to the width gw2 of the second gap portion g1b of the initial interdigital gap in the second direction D2.

In some embodiments, in two second mask patterns, located at two ends in the second direction D2, among the plurality of second mask patterns 70*a*, one of the two second mask patterns located at the end may not cover an initial interdigital electrode. For example, the second mask pattern at the bottommost end shown in the FIG. 5B may not cover the initial interdigital electrode.

In some embodiments, the second photolithography process for forming the second mask layer 70 and the first photolithography process for forming the first mask layer 60 may share the same photomask. That is, the first photomask and the second photomask may be the same one photomask, and a position of the photomask in the second photolithography process is shifted in the second direction relative to a position of the photomask in the first photolithography process. In other words, the photomask is located at a first position in the first photolithography process and at a second position in the second photolithography process, and the second position is offset relative to the first position in the second direction D2. For example, a distance of the photomask being offset in the second direction D2 in the second lithography process is approximately equal to the width gw2 of the second gap portion gp2 and approximately equal to a difference between the second width W2 of the interdigital electrode FE formed subsequently and the first width W1 of the corresponding initial interdigital electrode E1. However, the present disclosure is not limited thereto.

In an alternative embodiment, the first photomask used in the first photolithography process and the second photomask used in the second photolithography process may be different photomasks. That is, the overall pattern of the first mask layer may be different from the overall pattern of the second mask layer, and the first mask width and the first mask spacing of the first mask patterns may be different from the second mask width and the second mask spacing of the second mask patterns, respectively. For example, the second mask width may also be greater than the first mask width, and the second mask spacing may also be smaller than the first mask spacing, and the present disclosure is not limited thereto.

Figure 6A:
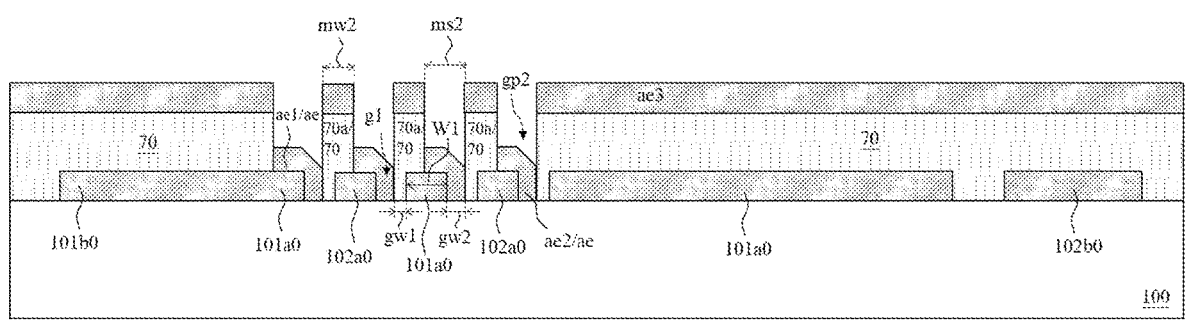
Figure 6B:
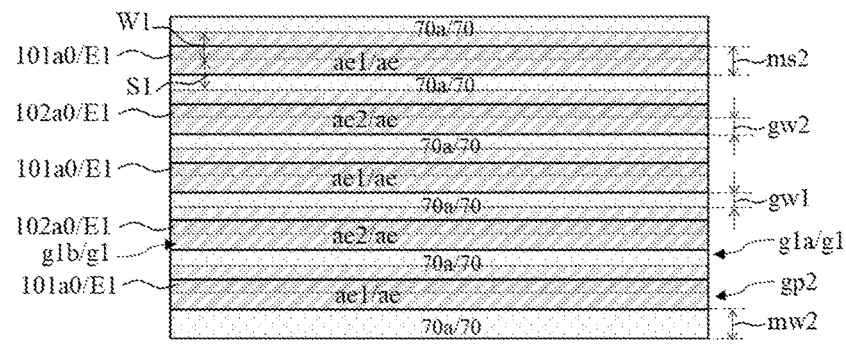

FIG. 6A illustrates a schematic cross-sectional view of forming an additional electrode layer on the piezoelectric substrate and the second mask layer, and FIG. 6B illustrates a schematic top view of forming the additional electrode layer in the second mask gaps of the second mask patterns disposed corresponding to the interdigital electrode body region.

Referring to FIG. 6A and FIG. 6B, in some embodiments, a second electrode material layer is formed on a side of the second mask layer 70 away from the piezoelectric substrate 100 and in the openings of the second mask layer. The second electrode material layer includes an additional electrode layer formed in the openings of the second mask layer, and a sacrificial portion ae3 formed on the side of the second mask layer 70 away from the piezoelectric substrate, and at least portions of the additional electrode layer are connected to the initial interdigital electrodes. For example, the additional electrode layer includes a plurality of additional interdigital electrodes ac formed in the second mask gaps gp2 of the plurality of second mask pattern 70*a*. The second electrode material layer may include a metal material, for example, may include one or more of metal materials such as Ti, Cr, Ag, Cu, Mo, Pt, W, Al, alloys thereof, the like, and combinations thereof. The second electrode material layer may be a single-layer structure or multi-layer structure, such as a stacked layer including a combination of two or more of the above-mentioned metal materials. The second electrode material layer may be formed by a deposition process such as evaporation. However, the present disclosure is not limited thereto. In some embodiments, the second electrode material layer and the first electrode material layer may be form of the same or different materials. In other words, the initial interdigital electrode and the additional interdigital electrode may include materials the same as or different from each other.

In some embodiments, the additional interdigital electrode ac formed in the second mask gap gp2 fills the second gap portion g1*b* of the initial interdigital gap g1, so as to contact a sidewall of the corresponding initial interdigital electrode E1, and may further cover and contact a portion of a surface of the initial interdigital electrode E1 at the side away from the piezoelectric substrate 100 and exposed by the second mask gap. The second gap portion g1*b* of each initial interdigital gap g1 is filled by one of the plurality of additional interdigital electrodes ac.

For example, the plurality of additional interdigital electrodes ae include one or more first additional interdigital electrodes ae1 and one or more second additional interdigital electrodes ae2. Each additional interdigital electrode is formed in the second mask gap gp2 between adjacent second mask patterns 70*a* and connected to (e.g., in direct contact with) the corresponding initial interdigital electrode E1. That is, the first additional interdigital electrode ae1 is connected to the first initial interdigital electrode 101*a*0, and the second additional interdigital electrode ae2 is connected to the second initial interdigital electrode 102*a*0.

In some embodiments, the additional electrode layer may further include a first additional interdigital electrode lead-out part and a second additional interdigital electrode lead-out part (not shown) that are respectively disposed on a side (e.g., a lower side shown in FIG. 1A) of the first initial interdigital electrode lead-out part 101*b*0 and a side (e.g., a lower side shown in FIG. 1A) of the second initial interdigital electrode lead-out part 102*b*0 in the second direction D2. The first additional interdigital electrode lead-out part may be in contact with a sidewall of the first initial interdigital electrode lead-out part, and may further extend to cover a portion of a surface of the first initial interdigital electrode lead-out part at a side away from the piezoelectric substrate 100. The second additional interdigital electrode lead-out part may be in contact with a sidewall of the second initial interdigital electrode lead-out part, and may further extend to cover a portion of a surface of the second initial interdigital electrode lead-out part at a side away from the piezoelectric substrate 100. A width of the first additional interdigital electrode lead-out part in the first direction D1 may be approximately equal to a width of the first initial interdigital electrode lead-out part in the first direction D1, and sidewalls that are opposite in the first direction D1 of the first additional interdigital electrode lead-out part and sidewalls that are opposite in the first direction D1 of the first initial interdigital electrode lead-out part may be substantially aligned with each other in the second direction D2, respectively. A width of the second additional interdigital electrode lead-out part in the first direction D1 may be approximately equal to a width of the second initial interdigital electrode lead-out part in the first direction D1, and sidewalls that are opposite in the first direction D1 of the second additional interdigital electrode lead-out part and sidewalls that are opposite in the first direction D1 of the second initial interdigital electrode lead-out part may be substantially aligned with each other in the second direction D2, respectively.

Referring to FIG. 6A and FIG. 7A, the second mask layer 70 and the sacrificial portion ae3 of the second electrode material layer covering the second mask layer 70 are removed, and the remained additional electrode layer includes at least a plurality of first additional interdigital electrodes ae1 and a plurality of second additional interdigital electrodes ae2, and may further include a first additional interdigital electrode lead-out part and a second additional interdigital electrode lead-out part. In some examples, the second mask layer 70 includes a photoresist material, and the second mask layer 70 and the overlying sacrificial portion ae3 of the second electrode material layer may be removed by a lift-off process.

FIG. 7B illustrates a schematic top view of the plurality of initial interdigital electrodes and the plurality of additional interdigital electrodes.

Referring to FIG. 7A and FIG. 7B, in some embodiments, the plurality of additional interdigital electrodes are disposed in one-to-one correspondence with the plurality of initial interdigital electrodes, and each additional interdigital electrode is at least in contact with the second sidewall of the corresponding one initial interdigital electrode. In some embodiments, the additional interdigital electrode may further extend to cover a portion of a surface of the corresponding initial interdigital electrode at the side away from the piezoelectric substrate. In other words, for the additional interdigital electrode and the initial interdigital electrode that are in contact with each other, an orthographic projection of the additional interdigital electrode on the piezoelectric substrate and an orthographic projection of the initial interdigital electrode on the piezoelectric substrate are at least adjoined with each other, and may overlap or not overlap each other.

For example, each first additional interdigital electrode ae1 and a corresponding one first initial interdigital electrode 101a0 are connected to each other and together constitute a first interdigital electrode 101a, and each second additional interdigital electrode ae2 and a corresponding one second initial interdigital electrode 102a0 are connected to each other and together constitute a second interdigital electrode 102a. The first interdigital electrode(s) 101a and the second interdigital electrode(s) 102a are arranged alternately along the second direction D2, and each interdigital electrode includes an initial interdigital electrode and an additional interdigital electrode that are connected to each other.

In some embodiments, in case that a same one photomask is used for the first patterning process illustrated in FIG. 2A to FIG. 4A and the second patterning process illustrated in FIG. 5A to FIG. 7A, additional interdigital electrode lead-out parts may be formed while the additional interdigital electrodes are formed. As such, the first initial interdigital electrode lead-out part 101b0 and the first additional interdigital electrode lead-out part may together constitute the first interdigital electrode lead-out part 101b. The second initial interdigital electrode lead-out part 102b0 and the second additional interdigital electrode lead-out part may together constitute the second interdigital electrode lead-out part 102b. However, the present disclosure is not limited thereto. In some other embodiments, the second patterning process may also form only the additional interdigital electrodes, without forming the additional interdigital electrode lead-out parts, and the first initial interdigital electrode lead-out part 101b0 and the second initial interdigital electrode lead-out part 102b0 may serve as the first interdigital electrode lead-out part 101b and the second interdigital electrode lead-out part 102b, respectively.

In some other embodiments, among the plurality of interdigital electrodes including one or more first interdigital electrodes 101a and one or more second interdigital electrodes 102a, each interdigital electrode has the second width W2 in the second direction D2, and every two adjacent interdigital electrodes have the second spacing S2 therebetween in the second direction D2. At least a portion of each additional interdigital electrode is located laterally aside the corresponding initial interdigital electrode in the second direction D2 and in contact with a sidewall of the initial interdigital electrode. The at least portion of the additional interdigital electrode serves as a widened portion for the initial interdigital electrode, such that the formed interdigital electrode has an increased width as compared with the initial interdigital electrode. An orthographic projection of the widened portion of the additional interdigital electrode on the piezoelectric substrate 100 and an orthographic projection of the corresponding initial interdigital electrode on the piezoelectric substrate are adjoined with each other without overlapping each other.

In some other embodiments, among the plurality of first additional interdigital electrodes ae1 and the plurality of second additional interdigital electrodes ae2, the third width W3 of each additional interdigital electrode and the third spacing S3 between adjacent additional interdigital electrodes in the second direction D2 are defined by related dimensions of the plurality of mask patterns 70a of the second mask layer 70. For example, the third width W3 of the additional interdigital electrode is defined by the second mask spacing ms2, that is, may be substantially equal to the second mask spacing ms2 between adjacent second mask patterns 70a. The spacing S3 between adjacent additional interdigital electrodes is defined by the second mask width mw2, that is, may be substantially equal to the second mask width mw2 of the second mask pattern 70a. In some embodiments, the third width W3 of the additional interdigital electrode may be substantially the same as the first width W1 of the initial interdigital electrode, and the third spacing S3 between adjacent additional interdigital electrodes may be substantially the same as the first spacing S1 between the corresponding initial interdigital electrodes. However, the present disclosure is not limited thereto.

In some embodiments, the widened portions of the plurality of additional interdigital electrodes are all disposed on a side close to the second sidewalls of the corresponding initial interdigital electrodes in the second direction D2. In other words, the plurality of initial interdigital electrodes are widened in the same direction. For example, in examples of FIG. 6B and FIG. 7B, the widened portion of each additional interdigital electrode is disposed below the corresponding initial interdigital electrode in the second direction D2 and in contact with the second sidewall of the initial interdigital electrode.

For example, each additional interdigital electrode is offset in the second direction D2 relative to the corresponding initial interdigital electrode by an additional width aw2. The additional width aw2 is a width of the widened portion of the additional interdigital electrode. The second width W2 of each interdigital electrode is substantially equal to a sum of the first width W1 of the initial interdigital electrode and the additional width aw2, and the second spacing S2 between adjacent interdigital electrodes is substantially equal to a difference between the first spacing S1 of adjacent initial interdigital electrodes and the additional width aw2. In some embodiments, a shift distance between a first mask pattern and a second mask pattern may be controlled and adjusted by controlling and adjusting the positions of the photomask in the two patterning processes, thereby controlling and adjusting the additional widths aw2 by which the additional interdigital electrodes offset, and further controlling the widths and spacing of the formed interdigital electrodes, so as to obtain interdigital electrodes with expected dimensions.

In some embodiments, the second spacing S2 between adjacent interdigital electrodes is smaller than the first mask width and/or the second mask width, for example, smaller than both of the first mask width and the second mask width, and the second width W2 of the interdigital electrode may be greater than the first mask spacing and/or the second mask spacing, for example, greater than both of the first mask spacing and the second mask spacing. In some embodiments, the related dimensions such as the spacing between initial interdigital electrodes formed by the first patterning process may be limit values that can be reached under current process conditions or accessible process conditions. For example, the first spacing between initial interdigital electrodes is a minimum value that can be reached under the current process conditions. In the embodiment of the present disclosure, in the case of using the current process conditions, through forming additional interdigital electrodes laterally aside the initial interdigital electrodes in the second patterning process, interdigital electrodes having a smaller spacing can be obtained, and the width of each interdigital electrode can be greater. As such, the limitation of the process conditions can be broken through, and expected patterns and dimensions of the device can be obtained. It should be understood that, the "process conditions" mentioned herein may include process condition of a photolithography process, such as related performance of a photolithography machine, and the like; and the current process conditions are not limited to a certain process node, but refer to in general the process conditions that can be achieved in the art, for example, the current process conditions may correspond to the existing most advanced process node or may represent a more advanced process node that can be achieved in future. The embodiments of the present disclosure are intended to break through the limitations of the process conditions to obtain interdigital electrodes having a smaller spacing and a greater width.

Figure 8A:
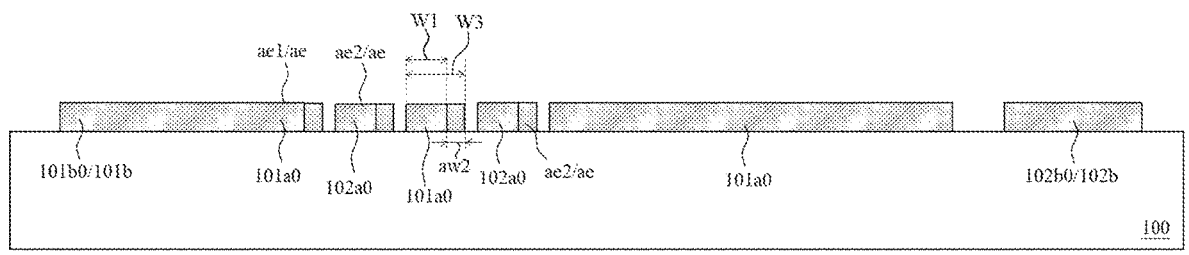

Referring to FIG. 7A and FIG. 8A, in some embodiments, a planarization process may be further performed to at least remove the protruding parts of the additional electrode layer that protrudes from the surfaces of the initial interdigital electrodes E1 at the side away from the piezoelectric substrate. For example, at least the plurality of protruding parts P1 of the plurality of additional interdigital electrodes ac may be removed by the planarization process. In an embodiment where the additional electrode layer includes additional interdigital electrode lead-out parts, the protruding parts of the additional interdigital electrode lead-out parts may also be removed by the planarization process. In some embodiments, after removing the protruding parts of the additional electrode layer, the planarization process may further remove portions of surfaces of the initial interdigital electrodes and/or portions of surfaces of the additional interdigital electrodes laterally aside the initial interdigital electrodes, thereby ensuring that the formed interdigital electrodes have a flat surface.

In some embodiments, after the planarization process is performed, surfaces (i.e., the top surfaces shown in the figure) of the plurality of initial interdigital electrodes E1 at the side away from the piezoelectric substrate and surfaces (i.e., the top surfaces shown in the figure) of the plurality of additional interdigital electrodes ae at the side away from the piezoelectric substrate are substantially level with each other in the direction parallel with the main surface of the piezoelectric substrate. For example, the planarization process may include a grinding process such as a chemical mechanical polishing (CMP) process.

Figure 8B:
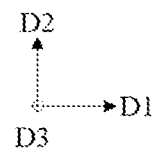
Figure 8B:

After the interdigital transducer is formed in the step illustrated in FIG. 8A and FIG. 8B, a first conductive connector and a second conductive connector may be formed on the first interdigital electrode lead-out part and the second interdigital electrode lead-out part, respectively. Thereafter, a passivation layer is formed, thereby forming the surface acoustic wave resonator device 500 illustrated in FIG. 1A to FIG. 1C.

In some embodiments, the abovementioned planarization process may be optionally performed. For example, in some examples, the planarization process may be omitted. That is, the protruding parts of the additional interdigital electrodes may be retained in the formed surface acoustic wave resonator device, and the formed interdigital electrodes have the structure shown in FIG. 7A and FIG. 7B.

In the manufacturing method of the surface acoustic wave resonator device in the above examples, both of the first patterning process and the second patterning process use a photoresist lift-off process to realize patterning of the electrode material. However, the present disclosure is not limited thereto. In some alternative embodiments, the first patterning process and/or the second patterning process may also adopt a patterning process including photolithography and etching processes, in which an electrode material layer may be formed firstly, and a patterned mask layer is formed on the electrode material layer, thereafter, an etching process is performed on the electrode material layer using the patterned mask layer as an etching mask, thereby realizing the patterning of the electrode material layer. Adopting such a patterning process can also achieve the technical effect substantially the same as those described in the foregoing embodiments of the present disclosure.

An embodiment of the present disclosure provides a filter including the abovementioned surface acoustic wave resonator device, and the surface acoustic wave resonator device may be formed by the above manufacturing method to have interdigital electrodes with a smaller spacing and a greater width, thereby increasing the frequency and the quality factor of the surface acoustic wave resonator device and the filter.

In the embodiments of the present disclosure, under accessible process conditions, the initial interdigital electrodes are formed by the first patterning process and the additional interdigital electrodes are formed by the second patterning process, such that the initial interdigital electrodes and the additional interdigital electrodes together constitute the interdigital electrodes of the resonator device. Through the two patterning processes, the limitations of the process conditions can be broken through, so that the interdigital electrodes with a smaller spacing and a greater width can be obtained, thereby enhancing the frequency and the quality factor (Q value) of the resonator device. Therefore, a resonator device and a filter having a higher frequency and better performance can be obtained. Moreover, in some embodiments, the first patterning process and the second patterning process may use a same one photomask, and the photomask may be offset by a predetermined distance in a predetermined direction in the second patterning process, so that interdigital electrodes having expected dimensions can be obtained. In this way, no extra photomask needs to be added, through which the process can be simplified and the manufacturing cost can be saved.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

The invention claimed is:

1. A method for manufacturing a surface acoustic wave resonator device, comprising:
    providing a piezoelectric substrate; and
    forming an interdigital transducer on the piezoelectric substrate, wherein the interdigital transducer comprises a plurality of interdigital electrodes, and the plurality of interdigital electrodes extend along a first direction and are arranged at intervals along a second direction, wherein forming the interdigital transducer on the piezoelectric substrate comprises:
    forming a plurality of initial interdigital electrodes on the piezoelectric substrate, wherein in the second direction, each initial interdigital electrode has a first width, and every two adjacent initial interdigital electrodes have an initial interdigital gap with a first spacing therebetween; and
    forming a plurality of additional interdigital electrodes on the piezoelectric substrate, wherein the plurality of additional interdigital electrodes are respectively connected to the plurality of initial interdigital electrodes, and each initial interdigital gap has a portion filled by one of the plurality of additional interdigital electrodes; each interdigital electrode comprises an initial interdigital electrode and an additional interdigital electrode that are connected to each other;
    wherein in the second direction, the each interdigital electrode has a second width, and every two adjacent interdigital electrodes have a second spacing therebetween; the second width of the each interdigital electrode is greater than the first width of a corresponding initial interdigital electrode, and the second spacing between two adjacent interdigital electrodes is smaller than the first spacing between corresponding two adjacent initial interdigital electrodes,
    wherein
    forming the plurality of initial interdigital electrodes comprises performing a first patterning process using a photomask, and the photomask is placed at a first position during the first patterning process;
    forming the plurality of additional interdigital electrodes comprises performing a second patterning process using the photomask, wherein the photomask is placed at a second position during the second patterning process; and
    the second position is offset relative to the first position in the second direction.

2. The method for manufacturing the surface acoustic wave resonator device according to claim 1, wherein the plurality of additional interdigital electrodes are formed to further cover portions of surfaces of the plurality of initial interdigital electrodes away from the piezoelectric substrate, respectively, and the plurality of additional interdigital electrodes respectively comprise a plurality of protruding parts; the plurality of protruding parts respectively protrude from the surfaces of the plurality of initial interdigital electrodes away from the piezoelectric substrate in a third direction perpendicular to the piezoelectric substrate.

3. The method for manufacturing the surface acoustic wave resonator device according to claim 2, further comprising:
    performing a planarization process to at least remove the plurality of protruding parts of the plurality of additional interdigital electrodes.

4. The method for manufacturing the surface acoustic wave resonator device according to claim 1, wherein in the second direction, each additional interdigital electrode has a third width; every two adjacent additional interdigital electrodes have a third spacing therebetween; the third width is smaller than or equal to the first width; and the third spacing is greater than or equal to the first spacing.

5. The method for manufacturing the surface acoustic wave resonator device according to claim 4, wherein the third width is equal to the first width, the third spacing is equal to the first spacing, and the each additional interdigital electrode is offset with respect to a corresponding initial interdigital electrode in the second direction by a predetermined shift distance, and the predetermined shift distance is smaller than the first width and the third width.

6. The method for manufacturing the surface acoustic wave resonator device according to claim 1, wherein forming the plurality of initial interdigital electrodes on the piezoelectric substrate through the first patterning process comprises: forming a first mask layer on the piezoelectric substrate, wherein the first mask layer comprises a plurality of first mask patterns; and in the second direction, each first mask pattern has a first mask width, and every two adjacent first mask patterns have a first mask gap with a first mask spacing therebetween; forming the plurality of initial interdigital electrodes in the first mask gaps of the plurality of first mask patterns; and removing the first mask layer; and wherein forming the plurality of additional interdigital electrodes on the piezoelectric substrate through the second patterning process comprises: forming a second mask layer on the piezoelectric substrate, wherein the second mask layer comprises a plurality of second mask patterns, and in the second direction, each second mask pattern has a second mask width, and every two adjacent second mask patterns have a second mask gap with a second mask spacing therebetween; wherein each initial interdigital gap comprises a first gap portion and a second gap portion; the first gap portion is filled by one of the plurality of second mask patterns, and the second gap portion is in spatial communication with the second mask gap; forming the plurality of additional interdigital electrodes in the second mask gaps of the plurality of second mask patterns, wherein the second gap portion of the each initial interdigital gap is filled by one of the plurality of additional interdigital electrodes; and removing the second mask layer.

7. The method for manufacturing the surface acoustic wave resonator device according to claim 6, wherein
    the plurality of initial interdigital electrodes each comprise a first portion and a second portion adjacent to each other in the second direction;
    the plurality of second mask patterns cover sidewalls of first portions of the plurality of initial interdigital electrodes and surfaces of the first portions of the plurality of initial interdigital electrodes at a side away from the piezoelectric substrate, and the second mask gaps of the plurality of second mask patterns expose sidewalls of second portions of the plurality of initial interdigital electrodes and surfaces of the second portions of the plurality of initial interdigital electrodes at a side away from the piezoelectric substrate.

8. The method for manufacturing the surface acoustic wave resonator device according to claim 6, wherein
the first mask layer is formed by a first photolithography process using the photomask, the first photolithography process is a part of the first patterning process; and
the second mask layer is formed by a second photolithography process using the photomask, the second photolithography process is a part of the second patterning process.

9. The method for manufacturing the surface acoustic wave resonator device according to claim 8, wherein a distance by which the photomask is offset in the second direction during the second photolithography process is equal to a difference between the second width of the interdigital electrode and the first width of the initial interdigital electrode.

10. The method for manufacturing the surface acoustic wave resonator device according to claim 6, wherein the second spacing between adjacent interdigital electrodes is smaller than the first mask width or the second mask width; and/or
the second width of the interdigital electrode is greater than the first mask spacing or the second mask spacing.

\* \* \* \* \*